(12) United States Patent
Hsu

(10) Patent No.: US 7,330,802 B2
(45) Date of Patent: Feb. 12, 2008

(54) METHOD FOR CALIBRATING PARAMETER OF INTEGRATED CIRCUIT

(75) Inventor: Chi-Ho Hsu, Kinmen County (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 11/540,970

(22) Filed: Oct. 2, 2006

(65) Prior Publication Data
US 2007/0250282 A1 Oct. 25, 2007

(30) Foreign Application Priority Data
Apr. 21, 2006 (TW) .............................. 95114222 A

(51) Int. Cl.
*G06F 19/00* (2006.01)
(52) U.S. Cl. ........................................ 702/85; 702/107
(58) Field of Classification Search .................. 702/85, 702/86, 106, 117; 365/96, 225.7; 330/9, 330/51; 324/76.11, 601
See application file for complete search history.

(56) References Cited
U.S. PATENT DOCUMENTS
5,619,430 A * 4/1997 Nolan et al. .................. 702/63

| 6,151,238 A | * | 11/2000 | Smit et al. ..................... 365/96 |
| 6,515,464 B1 | * | 2/2003 | Darmawaskita et al. . 324/76.11 |
| 2001/0044702 A1 | | 11/2001 | Rocchi et al. .............. 702/107 |
| 2003/0095008 A1 | | 5/2003 | Kranz ......................... 331/18 |
| 2005/0198404 A1 | | 9/2005 | Kawakami et al. ............ 710/1 |

* cited by examiner

*Primary Examiner*—Bryan Bui
(74) *Attorney, Agent, or Firm*—Troxell Law Office, PLLC

(57) ABSTRACT

A method for calibrating a parameter of an IC, using an external device so as to calibrate an analog control parameter of an internal analog circuit in the IC. The external device is used in a detecting mode so as to detect whether the analog control parameter is beyond a pre-determined range. If the analog control parameter is beyond the pre-determined range, the external device is used in a calibrating mode so as to obtain a calibrated value and the calibrated value is then written into the internal analog circuit in the IC. The external device is used for detection and calibration repeatedly until the analog control parameter is within the pre-determined range. When the analog control parameter is within the pre-determined range, the calibrated value is written into a non-volatile memory in the IC.

17 Claims, 7 Drawing Sheets

METHOD FOR CALIBRATING PARAMETER OF INTEGRATED CIRCUIT

BACKGROUND OF THE INVENTION

1. Field of the Invention

The present invention generally relates to a method for calibrating a parameter of an integrated circuit (IC) and more particularly, to a method for calibrating a parameter of an IC using an external device so as to calibrate an analog control parameter of an internal analog circuit in the IC.

2. Description of the Prior Art

With the development in semiconductor technology, the demand on the accuracy in output signals from the electronic circuit increases. However, inaccuracy inevitably happens in manufacturing processing. For example, in an RC oscillation circuit 11 in an IC 1 (in FIG. 1), the inaccuracy in the output RC oscillation frequency may exceeds ±20% Therefore, it is required to reduce the inaccuracy to an acceptable range using a calibrating step.

Please refer to FIG. 1, which is a conventional IC layout for calibrating a parameter of an IC. There are provided with a plurality of trim pads (Trim Pad 1, Trim Pad 2, . . . , Trim Pad n) inside the IC. When the output RC oscillation frequency of, the RC oscillation circuit 11 is detected to go beyond a pre-determined range, hardware is fused to calibrate the output and reduce the inaccuracy to an acceptable range. However, the cost of hardware is increased for an IC demanding high accuracy because more fuse pads are required.

Please refer to FIG. 2, which is another conventional IC layout for calibrating a parameter of an IC. Before the IC 2 is ordered to be shipped, an internal analog circuit 22 in the IC 2 is tested in a testing mode, and correction is made according to the tested results. An I/O unit 24 is used to program a non-volatile memory 23 in the IC 2 with the corrected calibrated value. Generally, the internal analog circuit 22 includes an RC oscillation circuit 221 and a low-voltage detection circuit 222. Moreover, if the non-volatile memory 23 is implemented using a low-cost erasable programmable read-only memory (EPROM), the calibrated value programmed in the non-volatile memory 23 may not be optimum because the EPROM can only be programmed once. If the non-volatile memory 23 is implemented using a high-cost electrically erasable programmable read-only memory (EEPROM) or other re-programmable non-volatile memories, the non-volatile memory 23 can be re-programmed when the calibrated value programmed in the non-volatile memory 23 is not optimum because the EEPROM can be programmed repeatedly. However, the cost for EEPROM is much higher than that for EPROM.

Therefore, there exists a need in providing a method for calibrating a parameter of an IC with high accuracy and low cost.

SUMMARY OF THE INVENTION

It is a primary object of the present invention to provide a method for calibrating a parameter of an IC using an external device with a testing mode and a calibrating mode so as to enhance the accuracy in the output value from an internal analog circuit in an IC.

In order to achieve the foregoing object, the present invention provides a method for calibrating a parameter of an integrated circuit (IC), the method comprising steps of: (a) inputting an initial value into a latch register in the IC; (b) reading the initial value input into the latch register by using an internal analog circuit in the IC and generating an output value according to the initial value; (c) detecting the output value by using an external device in a detecting mode; (d) determining whether the output value is beyond a pre-determined range and proceeding to step (e) if the output value is within the pre-determined range and, otherwise, proceeding to step (f); (e) obtaining a calibrated value by using the external device in a calibrating mode and inputting the calibrated value into the latch register and then returning to step (b); and (f) writing the calibrated value into a non-volatile memory in the IC.

Preferably, the external device is a programmer or a testing machine. The external device is capable of executing the step (f).

Preferably, the internal analog circuit is an RC oscillation circuit and the output value is an oscillation frequency.

Preferably, the non-volatile memory is one of an EPROM, an EEPROM and a flash ROM.

The present invention further provides a method for calibrating a parameter of an integrated circuit (IC), the method comprising steps of: (a) inputting an initial value into a latch register in the IC; (b) reading the initial value input into the latch register by using an internal analog circuit in the IC and generating an output value according to the initial value; (c) detecting the output value by using an external device in a detecting mode; (d) determining whether a corresponding value to the output value is beyond a pre-determined range and proceeding to step (e) if the output value is within the pre-determined range and, otherwise, proceeding to step (f); (e) obtaining a calibrated value by using the external device in a calibrating mode and inputting the calibrated value into the latch register and then returning to step (b); and (f) writing the calibrated value into a non-volatile memory in the IC.

Preferably, the external device is a programmer or a testing machine. The external device is capable of executing the step (f).

Preferably, the internal analog circuit is an RC oscillation circuit, the output value is an oscillation frequency and the corresponding value is an actual supply voltage.

Preferably, the non-volatile memory is one of an EPROM, an EEPROM and a flash ROM.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention providing a method for calibrating a parameter of an IC can be exemplified by the preferred embodiment as described hereinafter.

Figure 1:
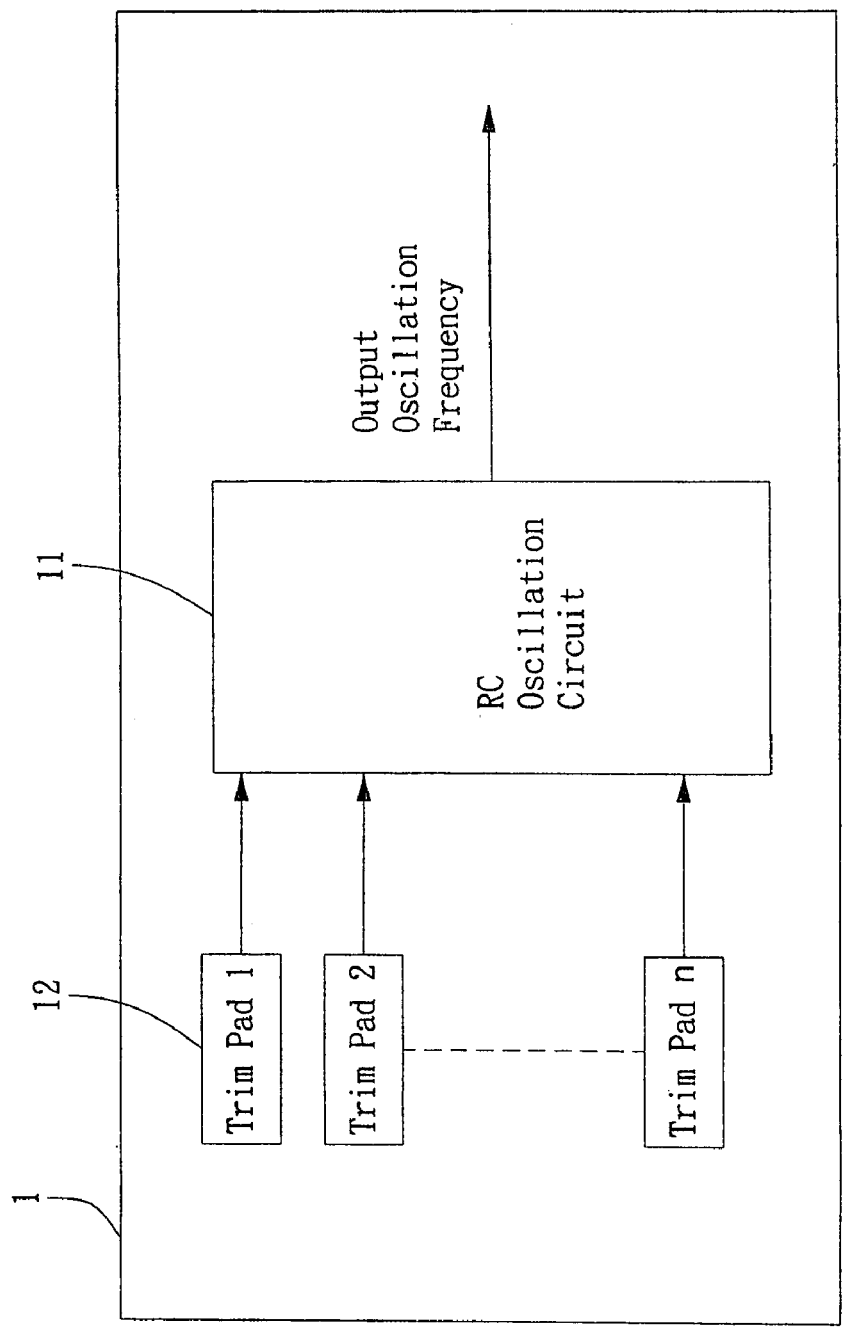
FIG. 1 is a conventional IC layout for calibrating a parameter of an IC.
Figure 2:
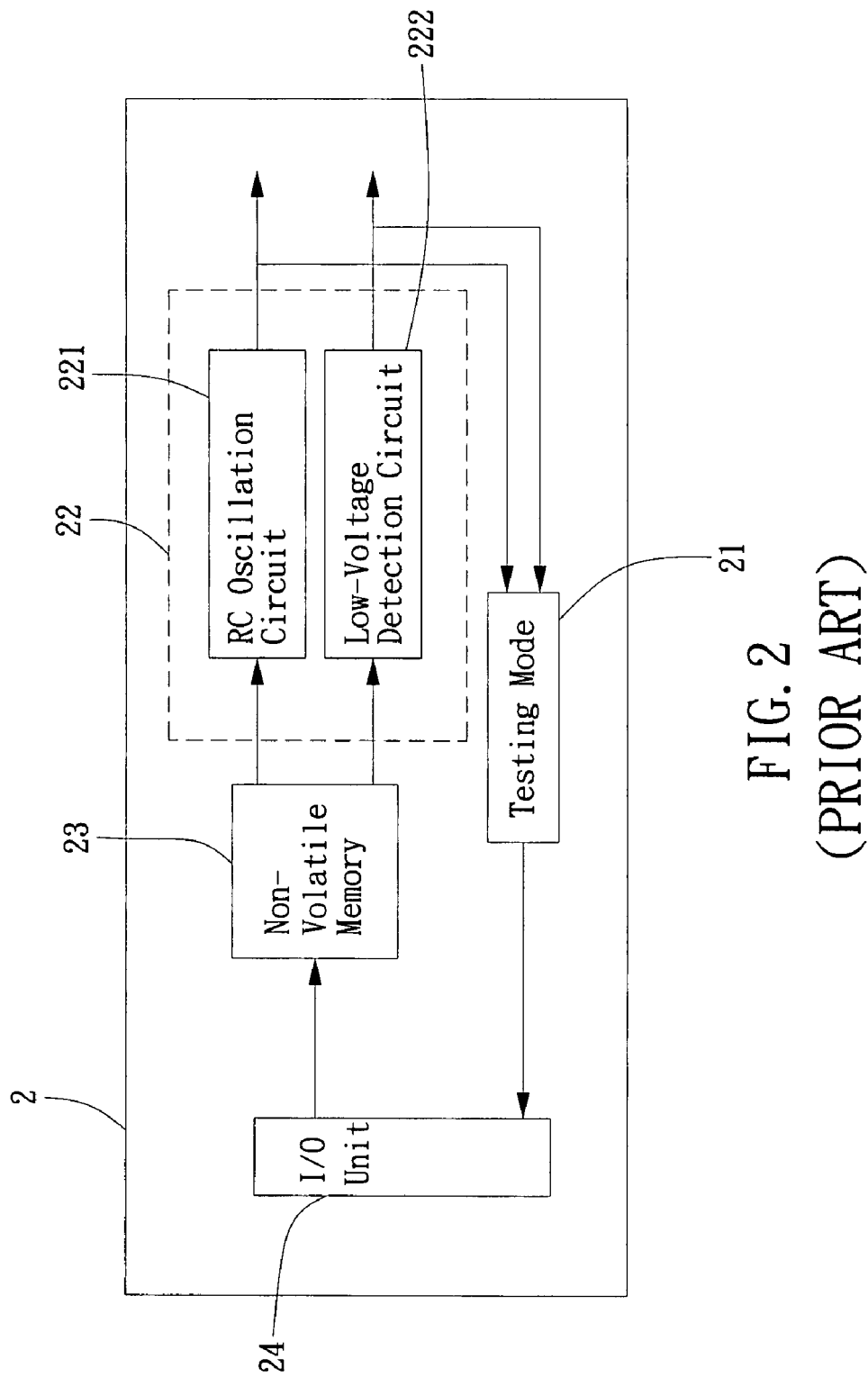
FIG. 2 is another conventional IC layout for calibrating a parameter of an IC.
Figure 3:
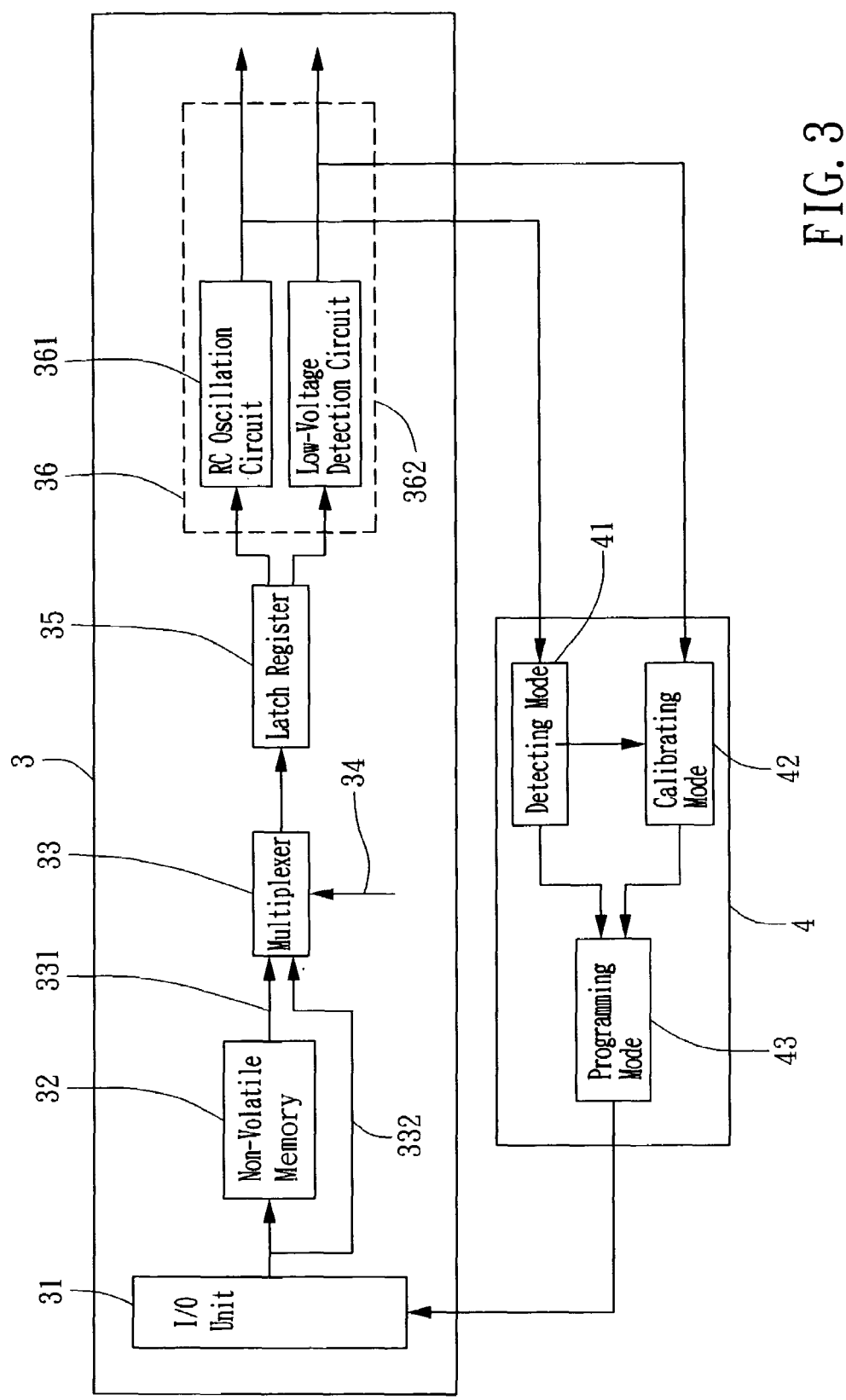
FIG. 3 is a block diagram for calibrating a parameter of an IC using an external device according to the present invention.

Please refer to FIG. 3, which is a block diagram for calibrating a parameter of an IC using an external device according to the present invention. The IC 3 comprises an I/O unit 31, a non-volatile memory 32, a multiplexer 33, a control signal input terminal 34, a latch register 35, and an internal analog circuit 36. The internal analog circuit 36 comprises an RC oscillation circuit 361 and a low-voltage detection circuit 362. The multiplexer 33 is a 2-to-1 multiplexer, in which there are a first input terminal 331, a second input terminal 332 and a output terminal 333. The multiplexer 33 selects data from the first input terminal 331 or the second input terminal 332 to be output according to the flag (0 or 1) from the control signal input terminal 34. The first input terminal 331 is electrically connected to one terminal of the non-volatile memory 32, while the other terminal of the non-volatile memory 32 is electrically connected to the I/O unit 31. The second input terminal 332 is electrically connected to the I/O unit 31. The input terminal of the latch register 35 is electrically connected to the output terminal of the multiplexer 33. The output terminal of the latch register 35 is electrically connected to the input terminal of the RC oscillation circuit 361 and the input terminal of the low-voltage detection circuit 362 so as to select to output to the RC oscillation circuit 361 or the low-voltage detection circuit 362 according to the analog control parameter (oscillation frequency or supply voltage).

The external device is a programmer 4 with a detecting mode 41 and a calibrating mode 42 so as to detect the output oscillation frequency from the output terminal of the RC oscillation circuit 361 in the detecting mode 41 or the level transition decision signal from the output terminal of the low-voltage detection circuit 362. In the present embodiment, the external device is exemplified by a programmer but not limited thereto. The external device can also be implemented using a testing machine or other devices capable of programming.

When the RC oscillation circuit 361 is detected in the detecting mode 41, the detected oscillation frequency is compared with a pre-determined value. If the oscillation frequency is beyond a range of the pre-determined value, the detecting mode 41 is switched to the calibrating mode 42 so as to obtain a calibrated value. The calibrated value is input into the I/O unit 31. On the contrary, if the oscillation frequency is within a range of the pre-determined value, the detecting mode 41 is remained so as to input the calibrated value into the I/O unit 31. The calibrated value is programmed into the non-volatile memory 32, using the programmer 4 in a programming mode 43. Similarly, when the low-voltage detection circuit 362 is detected in the detecting mode 41, a level transition decision signal is detected and an actual supply voltage corresponding to the level transition decision signal is compared with a pre-determined value. If the actual supply voltage is beyond a range of the pre-determined value, the detecting mode 41 is switched to the calibrating mode 42 so as to obtain a calibrated value. The calibrated value is input into the I/O unit 31. On the contrary, if the actual supply voltage is within a range of the pre-determined value, the detecting mode 41 is remained so as to input the calibrated value into the I/O unit 31 because the actual supply voltage is regarded as an ideal low-voltage transition point. The calibrated value is programmed into the non-volatile memory 32, using the programmer 4 in a programming mode 43.

When the calibrating mode 42 is switched on, the flag is set to a corresponding value (assumed to be 1) so that the multiplexer 33 selects data from the second input terminal 332. Similarly, when the calibrating mode 42 is switched off, the flag is set to a corresponding value (assumed to be 0) so that the multiplexer 33 selects data from the first input terminal 331.

Accordingly a precise oscillation frequency of the RC oscillation circuit 361 can be obtained as described hereinafter. First, an initial oscillation frequency is input into the latch register 35. The initial oscillation frequency is read by the RC oscillation circuit 361 so as to generate an oscillation frequency which is then input into the programmer 4. The programmer 4 operates in the detecting mode 41 so as to compare the oscillation frequency with a pre-determined value. If the oscillation frequency is beyond a range of the pre-determined value, the detecting mode 41 is switched to the calibrating mode 42 and the flag of the IC 3 is set to be 1 so as to obtain a calibrated value by calibrating the oscillation frequency. The calibrated value is then input into the I/O unit 31. Meanwhile, the multiplexer 33 selects the second input terminal 332 to read the calibrated value from the I/O unit 31 and store the calibrated value into the latch register 35 if the flag is 1. The RC oscillation circuit 361 reads the calibrated value from the latch register 35 and generates a new oscillation frequency. Then, the programmer 4 is switched to perform in the detecting mode 41 for detecting. The aforementioned operations repeat until the oscillation frequency is within the pre-determined value. Since the optimum calibrated value is obtained, the programmer 4 does not have to be switched to perform in the calibrating mode 42 and the flag is re-set to be 0. Meanwhile, the multiplexer 33 selects the first input terminal 331 to write the optimum calibrated value into the non-volatile memory 32. Moreover, if the oscillation frequency is within the range of the pre-determined value when the RC oscillation circuit 361 is detected in the detecting mode 41 in the beginning, the initial oscillation frequency is regarded as the optimum calibrated value to be written into the non-volatile memory 32 using the programmer 4.

Figures 4, 5:
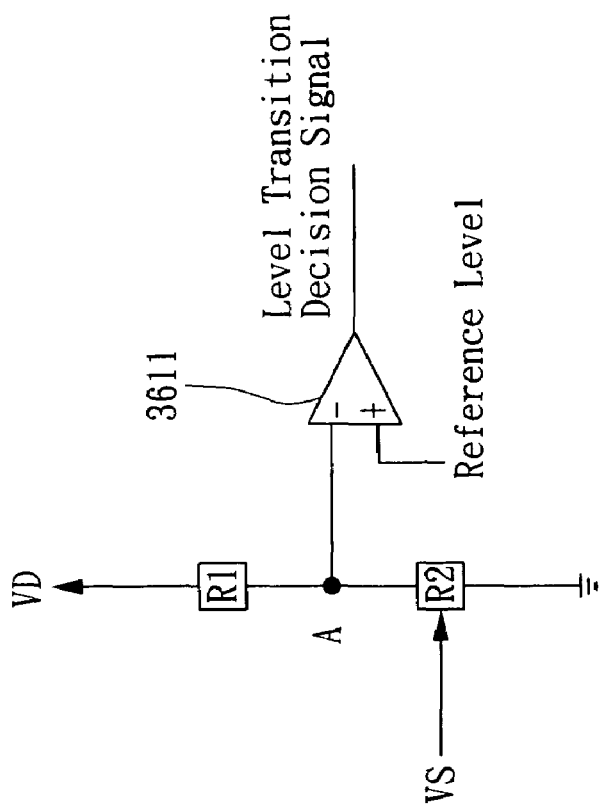
FIG. 4 is a circuit diagram of a low-voltage detection circuit in FIG. 3.
FIG. 5 is a table showing the pre-set supply voltage read by a low-voltage detection circuit in FIG. 3.

Please refer to FIG. 4, which is a circuit diagram of a low-voltage detection circuit in FIG. 3. The low-voltage detection circuit 362 comprises a first resistor R1, a second resistor R2, and a comparator 3611 for detecting a low-voltage transition point of the supply voltage of any circuit. In particular, the second resistor R2 determines the actual supply voltage at node A according to the pre-set supply voltage (VS) from the latch register 35. The actual supply voltage at node A is compared with a reference level at a non-inverting input terminal of the comparator 3611 so as to output a level transition decision signal (0 or 1) corresponding to the comparison result.

Please refer to FIG. 5, which is a table showing the pre-set supply voltage read by a low-voltage detection circuit in FIG. 3. For example, if the ideal low-voltage transition point of the low-voltage detection circuit is 3V, a table can be constructed based on the ideal low-voltage transition point and a suitable value can be selected from the table to be input into the low-voltage detection circuit.

Figure 6:
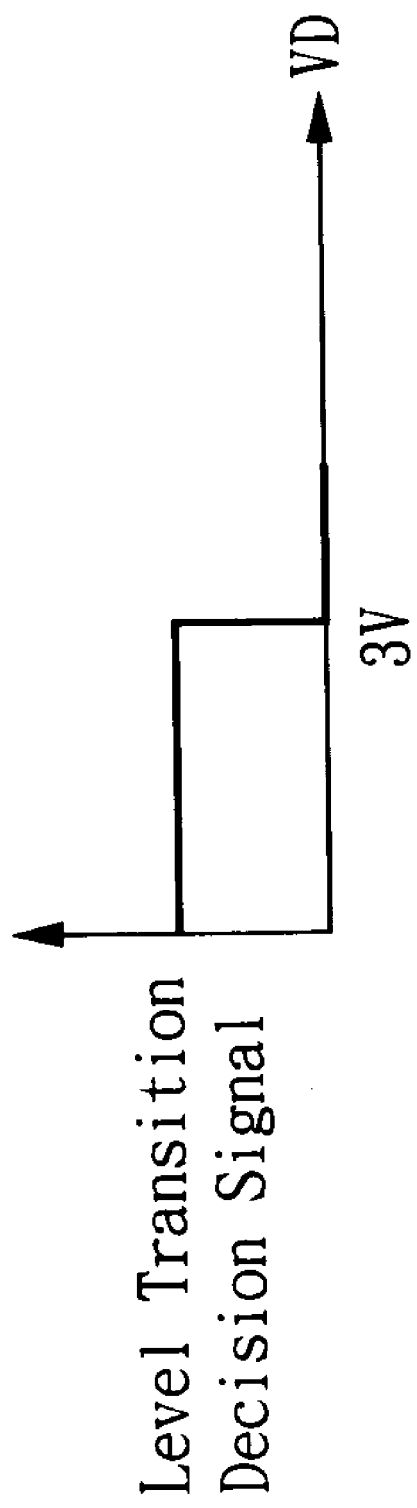
FIG. 6 is a graph showing the level transition decision signal of a low-voltage detection circuit in FIG. 3.

Please refer to FIG. 6, which is a graph showing the level transition decision signal of a low-voltage detection circuit in FIG. 3. In FIG. 6, if the actual supply voltage at node A in FIG. 4 is 3V, it indicates that the low-voltage transition point is 3V and the level transition decision signal is discontinuous at 3V.

In FIG. 3 to FIG. 5, in order for the low-voltage transition point to fall within the range of the pre-determined value, the pre-set supply voltage (3V) is input into the latch register 35 and then read by the low-voltage detection circuit 362 so as to generate an actual supply voltage at node A which is to be compared with the reference level at a non-inverting input terminal of the comparator so as to output a level transition decision signal corresponding to the comparison result. The level transition decision signal is detected by the external device in the detecting mode. The actual supply voltage corresponding to the level transition decision signal is then compared with a pre-determined value. If the actual supply voltage is beyond a range of the pre-determined value, the programmer 4 is switched to operate in the calibrating mode 42 and the flag of the IC 3 is set to be 1. A calibrated value is obtained by selecting a suitable supply voltage (VS) from the table in FIG. 5 according to the comparison result and then is input into the I/O unit 31. The follow-up steps are similar to those when using an RC oscillation circuit 361 and are therefore omitted.

Figure 7:
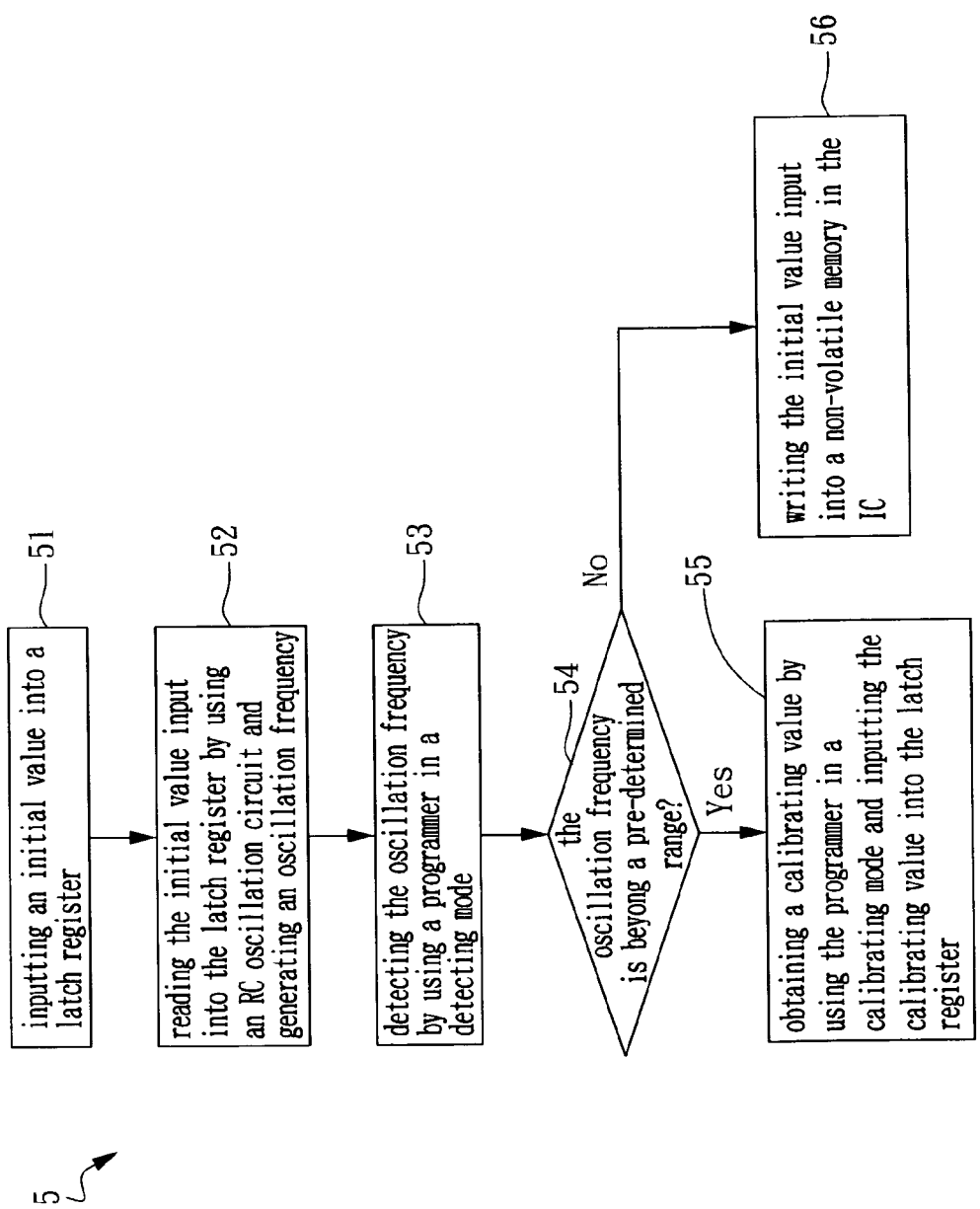
FIG. 7 is a flow-chart showing the method for calibrating an output RC oscillation frequency of an RC oscillation circuit according to the present invention.

Please refer to FIG. 7, which is a flow-chart showing the method for calibrating an output RC oscillation frequency of an RC oscillation circuit according to the present invention. The method comprises steps as described:

In Step 51, an initial value is input into a latch register in an IC.

In Step 52, the initial value input into the latch register is read by using an internal analog circuit in the IC so as to generate an output value according to the initial value.

In Step 53, the output value is detected by using a programmer in a detecting mode.

In Step 54, it is determined whether the output value is beyond a pre-determined range and the method proceeds to Step 55 if the output value is beyond the pre-determined range and, otherwise, the method proceeds to Step 56. For example, considering a case wherein a 100-MHz oscillation frequency is to be output, an initial value is pre-set to be 100 MHz and a range of the pre-set value is 100±1% MHz. Therefore, it meets the requirement when the detected oscillation frequency is between 99~101 MHz in the detecting mode. However, if the detected oscillation frequency is beyond the range of 100±1% MHz due to manufacturing processes and circuit design, the method proceeds to Step 55 and, otherwise, the method proceeds to Step 56 when the detected oscillation frequency is within the range of 100±1% MHz.

In Step 55, a calibrated value is obtained by using the external device in a calibrating mode so that the calibrated value is input into the latch register and then the method returns to Step 52. For example, in Step 53, if the detected oscillation frequency is 110 MHz in the detecting mode, the programmer is switched to operate in the calibrating mode because the detected oscillation frequency is compared in Step 54 to exceed the range of 100±1% MHz. Mathematic algorism such as the bisection method is used to calibrate the detected oscillation frequency and the calibrated value is stored in the latch register. Then the RC oscillation circuit reads the calibrated value from the latch register as an output oscillation frequency which is to be detected in Step 53 until the output oscillation frequency falls within the pre-determined range.

In Step 56, the calibrated value input into the latch register is written into a non-volatile memory in the IC.

Figure 8:
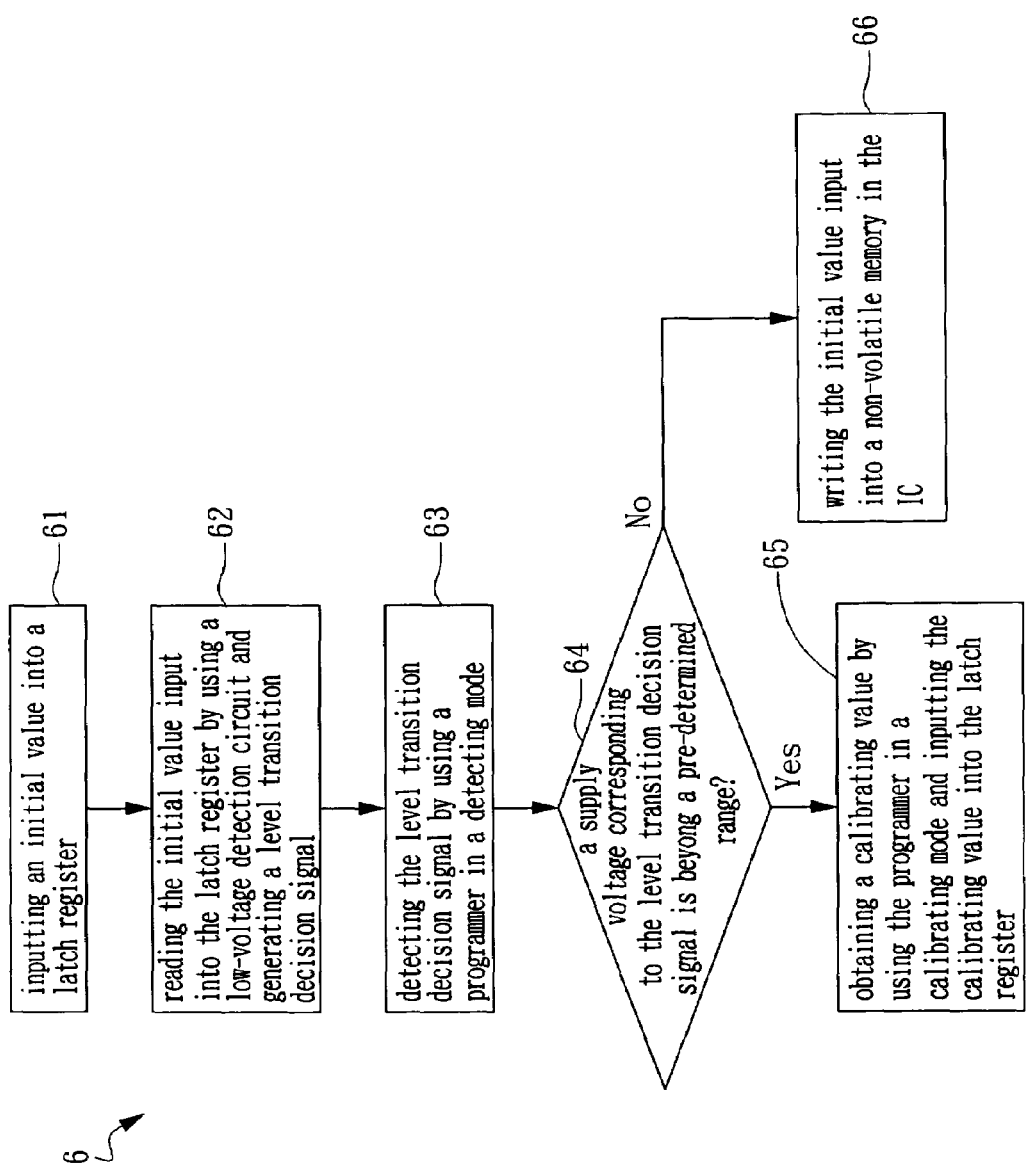
FIG. 8 is a flow-chart showing the method for detecting a low-voltage transition point of a low-voltage detection according to the present invention.

Please refer to FIG. 8, which is a flow-chart showing the method for detecting a low-voltage transition point of a low-voltage detection according to the present invention. The method comprises steps as described:

In Step 61, an initial value is input into a latch register in an IC.

In Step 62, the initial value input into the latch register is read by using an internal analog circuit in the IC so as to generate an actual supply voltage according to the initial value. The actual supply voltage is a low-voltage transition point. The actual supply voltage is then compared with a reference level so as to generate a level transition decision signal.

In Step 63, the level transition decision signal is detected by using a programmer in a detecting mode.

In Step 64, it is determined whether the actual supply voltage corresponding to the level transition decision signal is beyond a pre-determined range and the method proceeds to Step 65 if the actual supply voltage is beyond the pre-determined range and, otherwise, the method proceeds to Step 66. For example, considering a case wherein a low-voltage transition point is pre-set to be 3V (i.e., the actual supply voltage is 3V,) the initial value is set to be 3V and a table is constructed based on 3V. Assuming the pre-determined range is 3±3% V, it meets the requirement when the detected low-voltage transition point is between 2.91~3.09 V in the detecting mode. However, if the detected low-voltage transition point is beyond the range of 3±3% V due to manufacturing processes and circuit design, the method proceeds to Step 65 and, otherwise, the method proceeds to Step 66 when the detected low-voltage transition point is within the range of 3±3% V.

In Step 65, a calibrated value is obtained by using the external device in a calibrating mode so that the calibrated value is input into the latch register and then the method returns to Step 62. For example, in Step 63, if the actual supply voltage corresponding to the level transition decision signal is 3.2V in the detecting mode, the programmer is switched to operate in the calibrating mode because the detected actual supply voltage is compared in Step 54 to exceed the range of 2.91~3.09 V. A suitable pre-set supply voltage is selected from the table as the calibrated value. Since an input of 3V results in an actual supply voltage of 3.2V, an inaccuracy of 0.2V exists for an ideal low-voltage transition point. Therefore, the calibrated value is selected from the table to be 2.8V and is stored in the latch register in the IC. Then the low-voltage detection circuit reads the calibrated value from the latch register so as to generate a level transition decision signal which is to be detected in Step 63 until the supply voltage corresponding to the level transition decision signal falls within the pre-determined range.

In Step 66, the calibrated value input into the latch register is written into a non-volatile memory in the IC.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for calibrating a parameter of an integrated circuit (IC), the method comprising steps of:
   (a) inputting an initial value into a latch register in the IC;
   (b) reading the initial value input into the latch register by using an internal analog circuit in the IC and generating an output value according to the initial value;

(c) detecting the output value by using an external device in a detecting mode;

(d) determining whether the output value is beyond a pre-determined range and proceeding to step (e) if the output value is beyond the pre-determined range and, otherwise, proceeding to step (f);

(e) obtaining a calibrated value by using the external device in a calibrating mode and inputting the calibrated value into the latch register and then returning to step (b); and (f) writing the calibrated value into a non-volatile memory in the IC.

2. The method for calibrating a parameter of an IC as recited in claim 1, wherein the external device is a programmer.

3. The method for calibrating a parameter of an IC as recited in claim 2, wherein the programmer is capable of executing the step (f).

4. The method for calibrating a parameter of an IC as recited in claim 1, wherein the external device is a testing-machine.

5. The method for calibrating a parameter of an IC as recited in claim 4, wherein the testing machine is capable of executing the step (f).

6. The method for calibrating a parameter of an IC as recited in claim 1, wherein the internal analog circuit is an RC oscillation circuit.

7. The method for calibrating a parameter of an IC as recited in claim 6, wherein the output value is an oscillation frequency.

8. The method for calibrating a parameter of an IC as recited in claim 1, wherein the non-volatile memory is one of an EPROM, an EEPROM and a flash ROM.

9. A method for calibrating a parameter of an integrated circuit (IC), the method comprising steps of:

(a) inputting an initial value into a latch register in the IC;

(b) reading the initial value input into the latch register by using an internal analog circuit in the IC and generating an output value according to the initial value;

(c) detecting the output value by using an external device in a detecting mode;

(d) determining whether a corresponding value to the output value is beyond a pre-determined range and proceeding to step (e) if the output value is beyond the pre-determined range and, otherwise, proceeding to step (f);

(e) obtaining a calibrated value by using the external device in a calibrating mode and inputting the calibrated value into the latch register and then returning to step (b); and (f) writing the calibrated value into a non-volatile memory in the IC.

10. The method for calibrating a parameter of an IC as recited in claim 9, wherein the external device is a programmer.

11. The method for calibrating a parameter of an IC as recited in claim 10, wherein the programmer is capable of executing the step (f).

12. The method for calibrating a parameter of an IC as recited in claim 9, wherein the external device is a testing machine.

13. The method for calibrating a parameter of an IC as recited in claim 12, wherein the testing machine is capable of executing the step (f).

14. The method for calibrating a parameter of an IC as recited in claim 9, wherein the internal analog circuit is a low-voltage detection circuit.

15. The method for calibrating a parameter of an IC as recited in claim 14, wherein the output value is a level transition decision signal.

16. The method for calibrating a parameter of an IC as recited in claim 14, wherein the corresponding value is an actual supply voltage.

17. The method for calibrating a parameter of an IC as recited in claim 9, wherein the non-volatile memory is one of an EPROM, an EEPROM and a flash ROM.

* * * * *